AUTOMATIC TUNER CONTROL DEVICES

Filed April 5, 1966 3 Sheets-Sheet 1

INVENTORS
EMANUELE A. MORICI
CARMELO ZIMATORE
BY
Cushman, Darby & Cushman
ATTORNEYS INVENTORS
EMANUELE A. MORICI
CARMELO ZIMATORE
BY
Cushman, Darby & Cushman
ATTORNEYS Sept. 16, 1969 E. A. MORICI ET AL 3,467,871

AUTOMATIC TUNER CONTROL DEVICES

Filed April 5, 1966 3 Sheets-Sheet 3

INVENTORS
EMANUELE A. MORICI
CARMELO ZIMATORE
BY
Cushman, Darby & Cushman
ATTORNEYS United States Patent Office 3,467,871

Patented Sept. 16, 1969

3,467,871

AUTOMATIC TUNER CONTROL DEVICES

Emanuele A. Morici, Via Montedelle Gioie 9, and Carmelo Zimatore, Via Aiaccio 14, both of Rome, Italy Filed Apr. 5, 1966, Ser. No. 540,278
Claims priority, application Italy, Jan. 14, 1966, 702/66, Patent 754,303
Int. Cl. H04b 1/32
U.S. Cl. 325—470 15 Claims

ABSTRACT OF THE DISCLOSURE

An arrangement for automatically tuning a receiver provided with an electric tuning device. A discriminator compares an incoming signal with the resonant frequency of the tuning device. When non-coincidence exists, the discriminator causes a circuit to conduct to drive a generator connected to the tuning device thereby altering its resonant frequency. When the resonant frequency matches the frequency of the incoming signal, the discriminator terminates conduction of the drive circuit to interrupt the variation of the tuning device's resonant frequency.

The present invention relates to an automatic tuner control device, actuated by purely electric signals, for all kinds of electric signal receivers, such as radio, television, radar receivers and the like, to explore automatically and find signals present within a given frequency band, and to keep the receiver automatically tuned to said signal.

In addition, the present device is also capable of being retriggered into a new search of other signals, if this should become desirable, and of being disconnected, in order to tune the receiver to a frequency, for instance to a determined emitter, in the conventional manner.

The present device is applicable to all receivers provided with those tuning systems whose resonance is varied by purely electric means, such as variable capacity diodes, ceramic devices whose capacity is a function of the voltage applied to them, devices whose inductance is a function of the current circulating in them, etc. For the sake of brevity, this kind of tuning system will be called hereinafter "electric tuning means."

Although in the commonly used receiving sets the search of signals is generally performed manually, there also exist known systems where this function is performed automatically by electromechanical means.

The main structural parts of such known tuning control arrangements consist of a motor coupled to mechanically variable tuning devices, and of a relay controlling the motor. The rotation of the motor causes the tuning device to explore a given frequency band. Once resonance with a sufficiently strong signal is attained, the relay is de-energized to stop the motor.

The main deficiency of such electromechanical tuning systems is their inherent inertia, which renders them prone to surpassing signals. Although they are generally provided with time-delay arrangements to remedy such a deficiency, their accuracy is necessarily affected by the unavoidable tolerances of all mechanical systems. They are, altogether, rather cumbersome and expensive, which limits their field of application.

It is therefore the main object of our prevent invention to eliminate the aforesaid disadvantages of the known art. It is a further object of our invention to realize an automatic tuning system which possesses the new feature of maintaining tuning even in the presence of a drift of the signal or in the receiver circuitry.

It possesses the additional new feature of maintaining tuning for a definite time period even in the absence of a signal, a feature which we will call "signal memory" hereinafter. The unit circuits are associated in such a way that the unit circuits used for the exploration of the frequency band and to obtain resonance are the same units, which maintain the correct tuning in the presence of said drifts or of detuning due to environmental causes.

In its essence, our invention consists in a novel electric association of means which are per se known, looped to the tuning system of an electric signal receiver. It comprises first means generating, in said tuning system, a pilot current or voltage, which we shall define "pilot information" hereinafter, which is variable in time, so as to induce in the tuning system, by the very variation of the pilot information, a variation in resonance, so as to drive the tuning system in an exploration within a given frequency band.

Said first means is in turn controlled by any type of circuit means, such as a bistable circuit, which is capable of being switched from a conducting condition into a non-conducting condition by a control signal applied to it by a discriminator means driven by the signal present in the receiver. Thus, the co-action between all these means can be adjusted by known measures in such a manner that, if during the exploration cycle induced in the tuning system by the first means, an incoming signal is found, this signal will drive the discriminator to switch the bistable type circuit into a non-conducting state, thereby terminating the exploration and maintaining the tuning system in resonance with the signal. When, on the other hand, detuning occurs in said system, as a consequence of given causes, the discriminator will convert this detuning into a voltage level which will switch the bistable type circuit into a conductive condition to feed the generator means and cause thereby the tuning system to restart its search until the error is corrected.

In order to explore repeatedly the predetermined frequency band, said combination is completed by associating to said pilot information generating means any type of monostable circuits which, once the pilot information in the generating means has reached a selected upper limit, cancels said information to permit a new exploration cycle to start from a predeterminable lower limit, thereby achieving a continuous repetition of pilot information, which varies between two pre-determined levels, and thereby inducing successive exploration cycles within the tuning system. Furthermore, according to our invention, when the tuning system is of the kind which draws power from the generating means, an isolating means of any suitable kind such as buffer units may be interposed between said tuning system and pilot information generating means to prevent reactions between these two.

These and other characteristics, objects and advantages of our invention will become apparent from the following detailed description, taken with reference to the attached drawings, of three different embodiments thereof, it being understood that said embodiments are here illustrated for a purely exemplificative purpose, and are in no way to be constructed as limitative to our invention, as it is within the range of every person skilled in the art to replace whatever circuit units or electronic components are here shown by any of the great number of devices capable of performing the same function. With reference to the drawings:

Figures 1, 2, 2A:
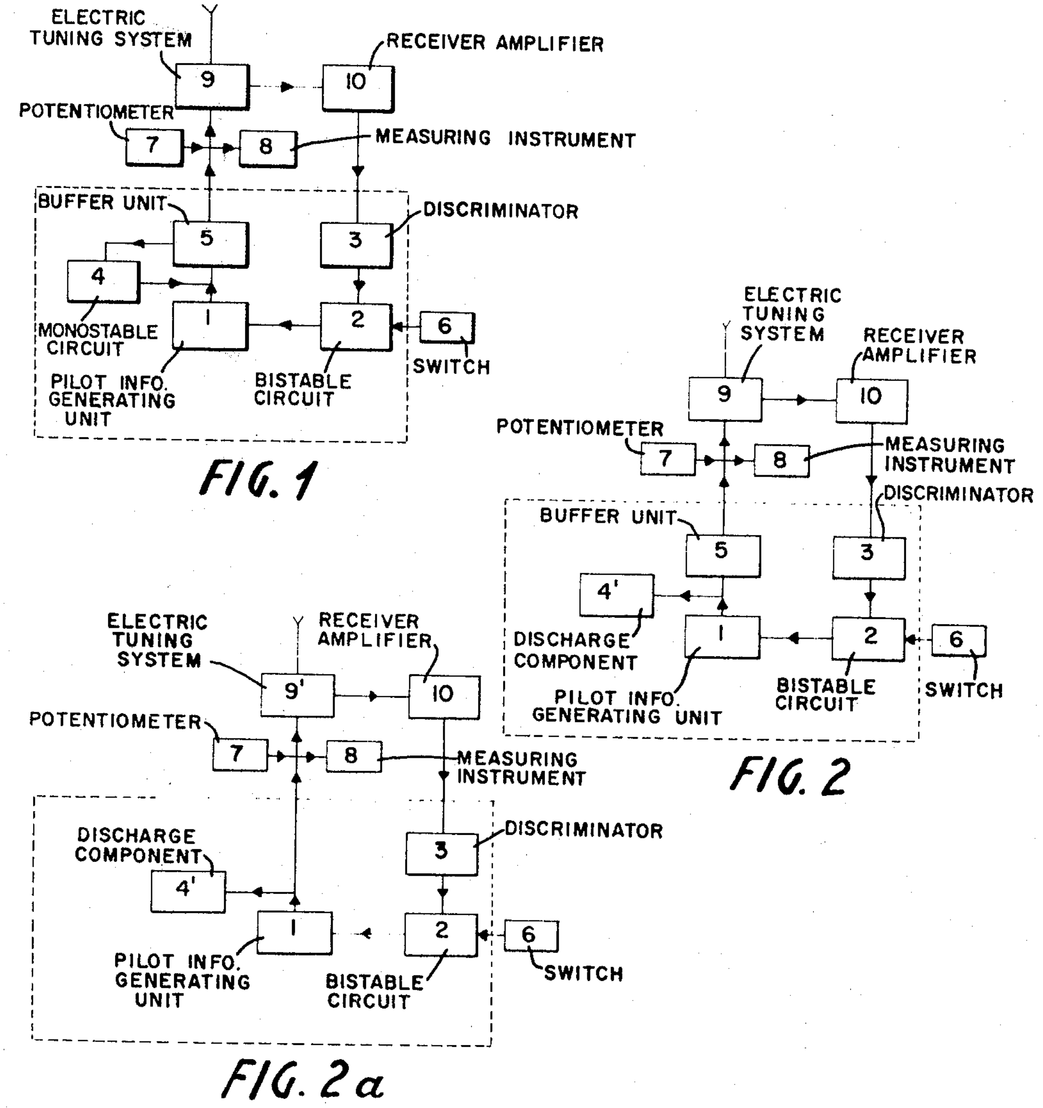
FIGURE 1 is a block diagram of a first embodiment of the automatic tuning control device of our present invention.
FIGURE 2 is a block diagram of a second embodiment of said device.

FIGURE 2*a* is a block diagram of a third embodiment of the device.

Figure 3:
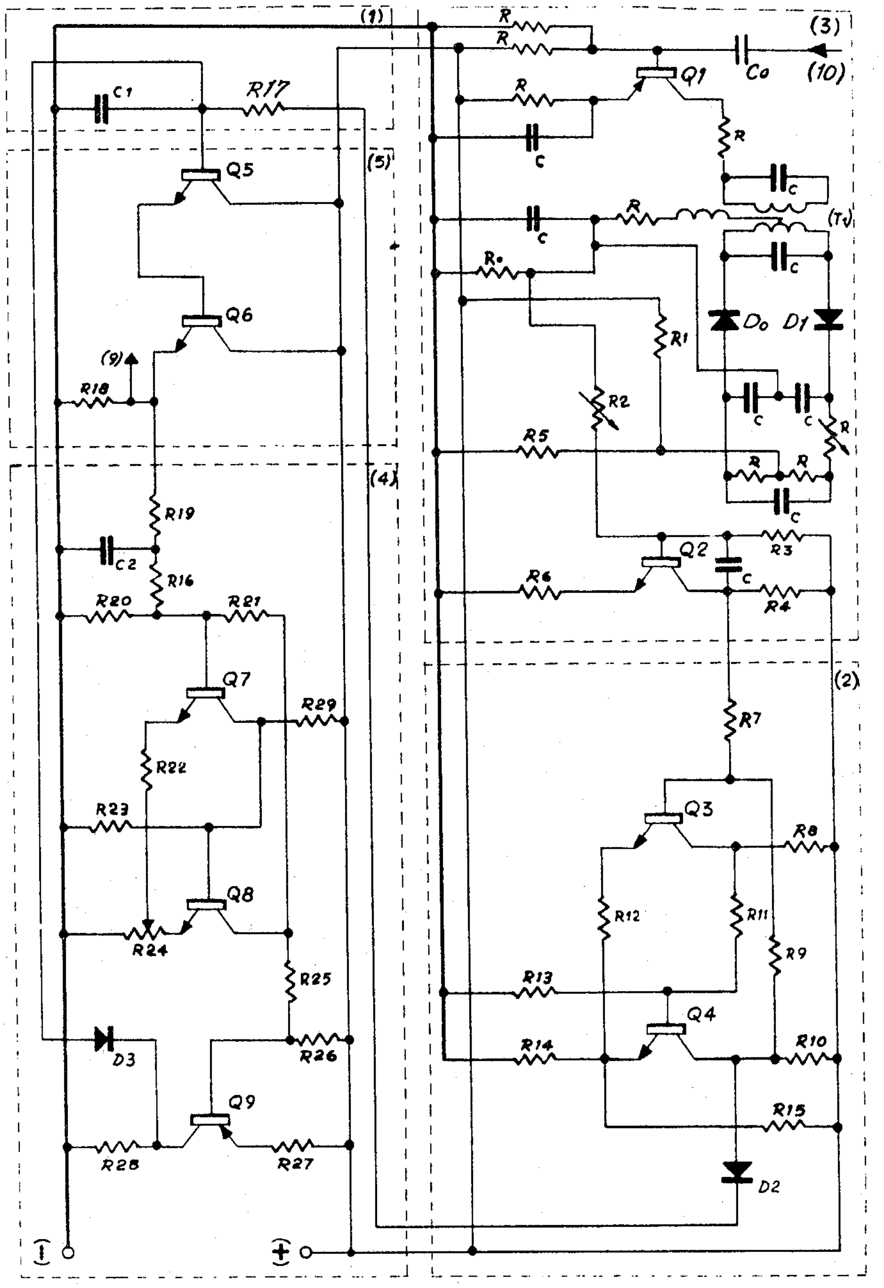
Figure 4:
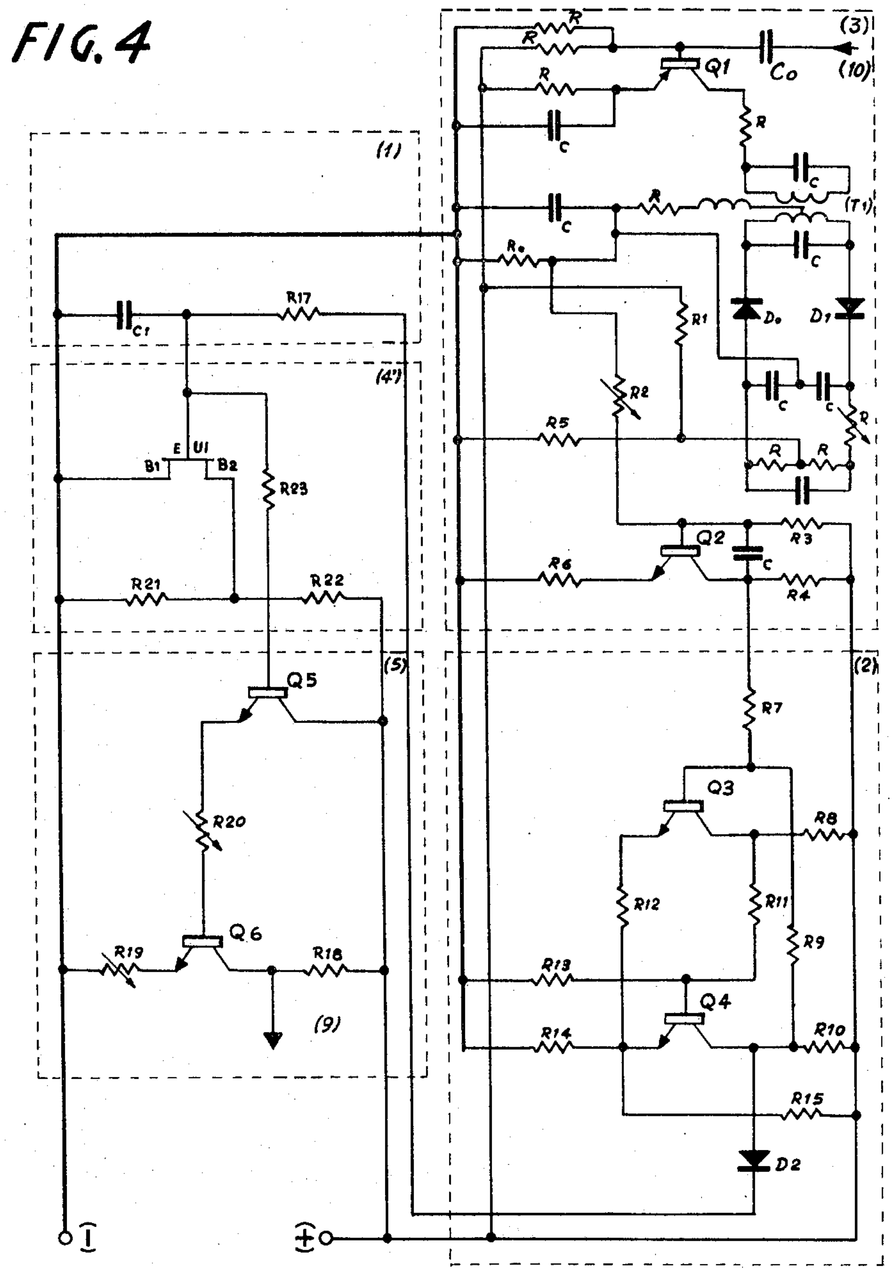

FIGURE 3 shows the circuitry corresponding to the block diagram shown in FIGURE 1, and FIGURE 4 shows the circuitry corresponding to the block diagram of FIGURE 2.

With reference to FIGURES 1, 2 and 2*a*, at 3 there is indicated a unit circuit capable of producing a given voltage value which may also equal 0, when there exists a coincidence between the frequency of an incoming signal and the resonance frequency of the circuit included in the block indicated at 3, and additionally to produce a voltage value which differs from the previous one by a given quantity when there exists a given difference between the resonance frequency of the circuit included in the block 3 and the frequency of the incoming signal; in the following such a circuit will be indicated by the term "discriminator."

The output voltage of circuit 3 is applied to a bistable circuit 2, that is, to a circuit whose output can be switched or triggered from a non-conducting into a conducting state, as a function of the two voltage values applied to it by the discriminator. The output of the bistable circuit 2 is connected to the pilot information generating unit 1. The unit used in the present embodiment is an RC circuit, capable of acquiring and storing an electric charge according to a definite temporal law, and whose output is connected (FIGURES 1 and 2) to an isolating unit 5. The isolating unit used in the embodiments of FIGURES 1 and 2 is a buffer unit, which has a high input resistance and which is capable of biasing, by behaving as a voltage or current generator, the electric tuning system indicated at 9. In the block diagram of FIGURE 1 a monostable circuit 4 is provided and connected in the way shown in said block diagram, with the unit circuits 1 and 5. This monostable circuit is capable of changing its state from a cut-off condition to a conducting condition once a given voltage value is reached and it maintains the conducting state for a given time period.

In the embodiments according to FIGURES 2 and 2*a*, the function of circuit 4 of FIGURE 1 is performed, as it will be explained later in greater detail, by circuit 4', which we shall indicate in the following as a discharge component. Said discharge component is an active component capable of considerably changing its input impedance correspondingly to a predetermined bias voltage value. Said component does not alter the electric charge stored by circuit 1, to which it is associated, until, once a predetermined bias voltage value is reached, it becomes conducting.

In all three embodiments shown, the discriminator is driven by the amplifier 10 of the receiver, said amplifier being preferably an intermediate frequency amplifier. The embodiment of FIGURE 2*a* is intended for tuning systems 9' which do not draw power from the RC unit 1 and thus render superfluous the buffer unit 5.

This association of units or blocks can be advantageously completed by additional devices performing auxiliary tasks: a push button switch 6 directly applied to the input of the bistable circuit unit 2, through which the latter can be directly triggered into a conducting condition by a suitable control signal; a potentiometer 7, directly connected to the tuning system, by which a variable polarization may be applied to it manually; and any suitable instrument 8, also directly connected to the tuning system, adapted to measure and visibly indicate the polarizing voltage or current of the latter.

The association of unit circuits or blocks operates in the following manner:

During the exploration stage, unit circuits 2, 1 and, where provided, unit circuit 5 produce, through their coaction, a variation of the pilot information applied to the electric tuning system 9 (or in the embodiment of FIGURE 2*a*, system 9'), so as to drive this tuning system to completely explore a given frequency band. To start the exploration, the bistable circuit 2 must be triggered into its conductive state by an external control signal, such as a signal applied to it directly, as by a switch or push button 6.

During this process, the discriminator 3 supplies through its output a voltage, which, in the absence of a signal in the tuner, is comprised between the two thresholds, of conduction and non-conduction, in the bistable circuit.

When, in the course of exploration, the tuning system is nearing resonance with an incoming signal, the output voltage of discriminator 3 shifts toward that threshold which would trigger the bistable unit into the conductive condition, in which, as stated above, this unit already finds itself, and for this reason it sweeps beyond this threshold without producing any triggering effect and thereafter, when the frequency of the tuning system is still closer approaching that of the incoming signal, it sweeps again through said conducting threshold and finally, when it attains perfect coincidence with that frequency, it stops at that threshold which triggers the bistable circuit 2 into the non-conductive state. As a result, the bistable circuit 2 stops charging the RC unit 1 and fixes thereby the tuning system 9 at the frequency of the signal found. In this manner, resonance with said signal is attained and the exploration ended.

The maintenance of the resonance with the incoming signal is conditioned to the presence of a suitable voltage value across the terminals of the capacitor in the RC unit 1

Voltage changes due to capacitor losses, or variations in environmental conditions will cause the tuning systems 9 or 9' to induce, through the amplifier, the discriminator to produce a control signal which triggers the bi-stable circuit into a conductive condition, and as a consequence thereof, exploration in the tuning system is resumed till the frequency error, that is the discrepancy between the frequency of the signal lost and that of the tuning system is corrected. We shall call this capacity "error correcting capacity."

Owing to it, the receiver will remain permanently tuned to the signal found. If it becomes desirable to find another signal, the system is swept into a new exploration of the frequency band by actuating switch 6, which directly triggers the bistable circuit unit 2 into a conductive state.

The RC circuit 1 causes the exploration of the frequency band to occur within a pre-established time, and, once a signal is found, to maintain the pilot information applied to the tuning system as long as possible at the level corresponding to said resonance. Owing to this capacity of the RC circuit, the receiver remains tuned to the signal even in the case of a momentary absence of the signal. This capacity will be termed: "pilot level memory of the tuning control means."

Where the tuning system is of the type which draws power from the unit circuit piloting it, such as the tuning systems 9 in the embodiments of FIGURES 1 and 2, a buffer unit 5 is insertd between these two, as a separating and piloting unit for the tuning system.

To keep the exploration of the band within the required frequency limits, and therefore the pilot information within the corresponding voltage or current levels, and in order to cause the exploration to restart from the lower frequency limit, once it has reached the upper frequency limit, in the embodiment of FIGURE 1 a monostable circuit 4 is provided, whose input is connected to an output of the buffer 5 and whose input is branched to the connection between units 1 and 5.

This monostable circuit is driven by the buffer 5 in such a manner, that when the voltage level in the capacitor of circuit 1 has reached an upper level corresponding to the upper frequency limit in the tuning system 9, it discharges the capacitor to the lower voltage level corresponding to the lower frequency limit in the tuning system.

Thus, this monstable circuit performs the task of determining the frequency band within which the exploration occurs, as well as the repetition of the exploration cycle.

The monostable circuit 4 can be replaced by equivalent devices. Thus, in the embodiments 2 and 2*a*, its task is performed by the discharge component 4', which in both instances, is directly associated to the capacitor unit circuit 1. This discharge component is illustrated in greater detail in FIGURE 4.

The visual indication, for instance on a scale, of the signal sought can be obtained by coupling the tuning system 9 and 9' to any known indicating instrument.

Obviously means can be provided in the receiver to switch the tuning system from the present automatic tuning control device to manual tuning, for instance by a conventional potentiometer 7 which varies the polarization of the tuning system.

In the wiring diagrams of FIGURES 3 and 4 each block 1, 2, 3, 4, 4' and 5 is outlined by rectangles drawn in dashed lines and the corresponding number is indicated between brackets at the upper right hand corner of each rectangle. The description will obviously only mention those components which appear essential to the understanding of the embodiments of FIGURES 1 and 2.

In FIGURE 3, the intermediate frequency signal is applied through the capacitor C0 at the base of the amplifier preceding the discriminator 3. This amplifier stage is so proportioned as to reach a satisfactory limitation when the level of the signal received is still very low.

In this manner the variation in the output voltage or current of the discriminator 3, in the proximity of the resonance frequency, is appreciably limited when there occurs a change of level in the signal found.

The voltage values at the discriminator 3 are proportional to the difference bteween the frequency of the signal and the resonance frequency of the tuning circuit T1.

The voltage present between the ends of resistor R0 is applied to the base of transistor Q2 to be amplified and reach, at the ends of resistor R4, the pre-established levels necessary to drive the bistable unit circuit 2. The circuit so far described is such that, in the absence of a signal, the voltage at the input of the bistable circuit 2 is comprised between two threshold or voltage levels mentioned in the following.

The transistors Q3 and Q4 and the diode D2 form part of the bistable unit circuit 2 and produce with their circuit, corresponding to two different voltage thresholds present at the ends of resistor R4, the conductive and the non-conductive state.

When the voltage level attains the conduction threshold, transistor Q3 is brought to saturation, the voltage across the resistor R8 drops and the polarization voltage in the base of transistor Q4 becomes such as to cut this transistor off. Under these conditions, to the anode of diode D2, which is connected to the collector of transistor Q4, there is imparted a polarization such that, owing to its arrangement, it causes the diode to behave as a conductor and therefore it charges the capacitor C1 of the RC unit 1 through resistor R17. A different voltage level, attaining the non-conduction threshold, present across the ends of resistor R4 brings the transistor Q3 into the cut-off condition, and the voltage across the ends of resistor R8 permits transistor Q4 to reach saturation.

Under these conditions diode D2 will be become inversely saturated, and functions as a very high resistance. Thus the capacitor C1 maintains across its ends the voltage value reached.

The use of this voltage, present across the ends of capacitor C1, as a pilot information occurs through transistors Q5 and Q6 of the buffer 5, which, in the arrangement shown, possess a very high input impedance and are such as to realize the pilot information generator necessary to pilot the electric tuning means 9.

Simultaneously transistors Q5 and Q6 permit the triggering of the monostable circuits 4 intended to delimit the voltage levels in circuit 1 and thus the frequency band explored, as well as to produce the repetition of the exploration cycle. When the voltage value between the ends of resistor 18 has reached a maximum value in the tuning system and correspondingly the tuning limit has reached resonance with the upper frequency limit, transistor Q7 is blocked, transistor Q8 is saturated, and the inverter transistor Q9 is cut off.

Under these conditions, the diode D3 whose cathode is connected to resistor R28, is directly biased, acts as a conductor and capacitor C1 is discharged through the small resistor R28.

This condition is maintained throughout the time it takes capacitor C2 to discharge on the circuits associated with it. Upon this time depends the minimum voltage bringing the resonance of the tuning system to the lower frequency limit and causing the repetition of the exploration cycles.

The diagram of FIGURE 4 showing the details of block diagram 2, differs from that of FIGURE 3 only with respect to that part which concerns the use of the pilot information present in capacitor C1.

In fact, this information is here utilized through transistors Q5 and Q6 and a particular transistor U1.

In the arrangement shown, transistors Q5 and Q6 manifest such a high impedance as to prevent the discharge of condenser C1.

In these transistors, particularly in the transistor Q5 connected to capacitor C1, the base bias varies with the variation of the voltage present at the ends of condenser C1. To it will correspond the variation in current in the transistor Q5 and in transistor Q6 directly coupled to it.

The variation in potential difference between the ends of resistor R18, consequent to the current variation, defines the piloting of the electric tuning means of the system 9.

The unijunction transistor U1 is a special active component capable of manifesting, in the input circuit, the two different conditions of conduction and non-conduction. When the bias voltage of the emitter is below a given value V*p*, which is a function of the potential difference existing between the bases (electrodes B1 and B2), the transistor presents a very high impedance, which prevents the discharge of capacitor C1 to which it is connected. Inversely, when the potential difference at the ends of C1 exceeds the definite value V*p*, the resistor between the emitter electrodes E and base electrode B1 will decrease until it becomes negative, i.e. there will occur an increase in current and, at the same time, a reduction of the potential difference. Capacitor C1, connected to the emitter of transistor U1, will quickly discharge to a pre-established voltage value.

What we claim is:

1. A device for automatically tuning electric signal receivers, fitted with electric tuning means, to incoming signals, comprising:

a discriminator coupled to said receiver and capable of producing a first voltage output when coincidence exists between the frequency of an incoming signal and the resonant frequency of said tuning means and a second voltage output when non-coincidence exists;

circuit means connected to the output of said discriminator and operable between conductive and non-conductive states as a function of the voltage applied thereto from said discriminator;

a pilot information generator joined to the output of said circuit means and capable of developing a pilot voltage output in response to the conduction of said circuit means; and means for connecting the pilot information output from said generator to said electric tuning means to vary the resonance of the electric tuning means until said circuit means is driven to its non-conductive state.

2. A device according to claim 1, wherein the connecting means to said electric tuner comprises a buffer unit interposed between the electric tuning means and said pilot information generator.

3. A device according to claim 2, further comprising monostable circuit means having an input coupled to an output of said buffer unit, and having its output connected between said pilot information generator and the buffer unit.

4. A device according to claim 1, further comprising a discharge component directly connected to the output of the pilot information generator.

5. An automatic tuning control device for electric signal receivers of all kinds, such as radio, television, radar and the like, comprising:

electric tuning means, means responsive to non-coincidence between the frequency of an incoming electric signal and the resonance frequency of said electric tuning means for developing a first voltage output, and responsive to coincidence between the signal frequency and the resonance frequency of the tuner to develop a different voltage output, a chargeable capacitor, a source of continuous voltage, means responsive to said first voltage output to couple said voltage source to the capacitor to charge same, and responsive to the different voltage output to isolate said capacitor from the voltage source, and means to connect said capacitor to the tuning means to vary the resonance frequency of the tuner as a function of the charge on the capacitor.

6. A device according to claim 5, further comprising means to short-circuit said capacitor when its charge has reached a given level and to maintain the short-circuit until said charge has dropped to another given level.

7. A device according to claim 5, wherein the means connecting the capacitor to the tuning means includes an amplifier having a high input impedance.

8. A device according to claim 5, wherein the means connecting the capacitor to the tuning means includes a metal oxide surface transistor having its gate electrode directly joined to the capacitor.

9. A device according to claim 5, wherein the means capable of coupling and isolating the capacitor from the source of continuous voltage includes:

a bistable circuit operable between two states in response to the voltage outputs developed by the means responsive to coincidence and non-coincidence of the signal frequency and the resonance frequency of the tuner, a diode having one electrode connected to the output of said bistable circuit and the other electrode connected to the capacitor whereby when said bistable device is in one state, the diode conducts to charge the capacitor, and when the bistable device is in its other state, the diode is cut-off to isolate said capacitor.

10. A device according to claim 5, wherein:

the means for developing the first and different voltage outputs is a discriminator, the incoming electric signal to which said discriminator is responsive being the intermediate frequency of the receiver, and the means coupling and isolating the capacitor from the source of continuous voltage being a bistable circuit, the discriminator supplying output voltages which are higher and lower respectively than two given thresholds of the bistable circuit when there exists a disparity of a given value between the frequency of the incoming signal and the resonant frequency of the electric tuning means.

11. A device according to claim 6, wherein the means to short-circuit the capacitor comprises:

a monostable circuit, circuit means having a high input impedance and an RC time constant connecting said capacitor to the monostable circuit, a diode having one of its electrodes connected to the capacitor and the other of its electrodes joined to the output of the monostable circuit, whereby on the attainment of a given charge level on said capacitor, said monostable circuit is driven to bias the diode into conduction thereby short-circuiting the capacitor, and wherein after a period dependent on said RC time constant, the monostable circuit returns to its original state to render said diode nonconductive thereby isolating said capacitor.

12. A device according to claim 6, wherein the means to short-circuit the capacitor comprises a unijunction transistor having its emitter connected to one side of said capacitor and one of its bases connected to the other side of the capacitor, whereby on the attainment of a given charge level on said capacitor, said unijunction transistor is biased into conduction to short-circuit the capacitor.

13. A device according to claim 5, further comprising a potentiometer which may be selectively coupled to said electric tuning means to directly apply a variable bias thereto.

14. A device according to claim 5, further comprising a switch directly coupled to the bistable circuit to bring the latter into the condition to which corresponds the conducting state of the diode.

15. A device according to claim 5, further comprising indicator means joined to said electric tuning means to display the electrical conditions thereof.

References Cited

UNITED STATES PATENTS

| | | | |
|---|---|---|---|
| 3,189,829 | 6/1965 | Bento et al. | 325—470 |
| 3,369,236 | 2/1968 | Westerfield et al. | 343—100 |

KATHLEEN H. CLAFFY, Primary Examiner

C. JIRAUCH, Assistant Examiner